(12) United States Patent
Kim et al.

(10) Patent No.: US 7,323,891 B2
(45) Date of Patent: Jan. 29, 2008

(54) METHOD OF TESTING A SEMICONDUCTOR CHIP AND JIG USED IN THE METHOD

(75) Inventors: Dae-Jong Kim, Gyeonggi-do (KR); Ho-Jeong Choi, Gyeonggi-do (KR); Chan-Soon Park, Gyeonggi-do (KR)

(73) Assignee: Samsung Electronics Co., Ltd., Suwon-si, Gyeongi-do (KR)

(*) Notice: Subject to any disclaimer, the term of this patent is extended or adjusted under 35 U.S.C. 154(b) by 0 days.

(21) Appl. No.: 11/420,205

(22) Filed: May 24, 2006

(65) Prior Publication Data

US 2007/0023610 A1    Feb. 1, 2007

(30) Foreign Application Priority Data

Jul. 29, 2005    (KR) .................. 10-2005-0069661

(51) Int. Cl.
*G01R 31/02* (2006.01)
(52) U.S. Cl. ..................................... 324/754
(58) Field of Classification Search ............... 324/754, 324/760
See application file for complete search history.

(56) References Cited

U.S. PATENT DOCUMENTS

| | | | |
|---|---|---|---|
| 5,073,117 A * | 12/1991 | Malhi et al. ................ | 439/71 |
| 6,191,404 B1 | 2/2001 | Poole et al. | |
| 6,236,046 B1 * | 5/2001 | Watabe et al. ........... | 250/338.1 |
| 6,335,629 B1 | 1/2002 | Lee et al. | |
| 6,340,838 B1 * | 1/2002 | Chung et al. ................ | 257/668 |
| 6,885,206 B2 * | 4/2005 | Halley ........................ | 324/755 |
| 7,177,018 B2 * | 2/2007 | Seeley ........................ | 356/154 |

FOREIGN PATENT DOCUMENTS

| | | |
|---|---|---|
| JP | 05-240700 | 9/1993 |
| KR | 2000-0008749 | 5/2000 |
| KR | 2001-0075498 | 8/2001 |

OTHER PUBLICATIONS

English language abstract of Japanese Publication No. 05-240700.

* cited by examiner

*Primary Examiner*—Ha Tran Nguyen
*Assistant Examiner*—Joshua Benitez
(74) *Attorney, Agent, or Firm*—Marger Johonson & McCollom, P.C.

(57) ABSTRACT

A method of and testing jig for sequentially testing front and rear surfaces of a semiconductor chip is shown. The testing jig includes a support package having a first cavity over which the semiconductor chip mounts; an infrared filter affixed relative to the first cavity and attached to a rear surface of the semiconductor chip; and a test substrate having a second cavity exposing the infrared filter and upon which the support package mounts. Front and rear surfaces of the semiconductor chip can be conveniently and sequentially tested. Because the testing jig includes the infrared filter and the heat pad, heat can be easily transmitted to the defective chip.

20 Claims, 12 Drawing Sheets

METHOD OF TESTING A SEMICONDUCTOR CHIP AND JIG USED IN THE METHOD

This application claims the priority of Korean Patent Application No. 10-2005-0069661, filed on Jul. 29, 2005, in the Korean Intellectual Property Office, the disclosure of which is incorporated herein in its entirety by reference.

BACKGROUND OF THE INVENTION

1. Field of the Invention

The present invention relates to an apparatus and method for fabricating a semiconductor device, and more particularly, to a method of testing a semiconductor chip for defects and a testing jig used in the method.

2. Description of the Related Art

In recent years, the capacity of memory cards has increased. As a result, portable devices such as mobile phones, PDAs and portable PCs have become smaller and thinner. Multi-chip packages (MCPs), in which a plurality of packages can be stacked in an area equal in size to that required by a conventional single package, are being mass-produced. Some MCP memory devices include at least three metal interconnecting layers.

FIG. 1 is a photograph illustrating defects present in a cross-section of a conventional semiconductor chip 32 (see FIG. 2). Referring to FIG. 1, the semiconductor chip 32 includes a front surface 10 on which a first metal interconnecting layer 12 and a second metal interconnecting layer 14 are formed and a rear surface 20 opposite the front surface 10. For convenience, a portion of the semiconductor chip 32 on which the first and second metal interconnecting layers 12 and 14 are formed is referred to as the front surface 10.

In FIG. 1, two metal interconnecting layers are illustrated. However, three or more metal interconnecting layers may be formed. A defect "a" is present in the first metal interconnecting layer 12 of the front surface 10, and a defect "b" is present in the second metal interconnecting layer 14 of the rear surface 20. The defects "a" and "b" cause a leakage current in the semiconductor chips 32.

FIG. 2 is a perspective view illustrating a conventional method of testing the front surfaces 10 of the semiconductor chips 32 for defects (for example, the defect "a"). FIG. 3 is a perspective view illustrating a conventional method of testing the rear surfaces 20 of the semiconductor chips 32 for defects (for example, the defect b).

Referring to FIG. 2, the semiconductor chips 32 are formed on a wafer 30 on which an electrical memory test has been performed. A test substrate 40 is placed above the wafer 30, and a plurality of contact pins 42 for signal processing are arranged on at least one side of the test substrate 40. Probe pins 44 at the center of the test substrate 40 protrude toward the wafer 30 and transmit external signals to the semiconductor chips 32. A detector 50 detects, for example, hot electrons emitted from the front surfaces 10 of the semiconductor chips 32.

Referring to FIG. 3, the wafer 30 supported by a support board 60 is placed above the test substrate 40 and is covered by an infrared lens 70. The detector 50 detects hot electrons emitted from the rear surfaces 20 of the semiconductor chips 32.

The conventional method of testing the semiconductor chips 32 has a number of problems. First, the method can be used to test the semiconductor chips 32 in units of wafers, but not in units of chips. Also, while a simple setup process is required to test the front surfaces 10 of the semiconductor chips 32, it takes a considerable amount of time to perform the necessary setup for testing the rear surfaces 20 of the semiconductor chips 32. As a result, it is difficult to sequentially test the front and rear surfaces 10 and 20 of the semiconductor chips 32. Conventional test equipment is believed to be not capable of sequentially testing the front and rear surfaces 10 and 20 of the semiconductor chips 32.

SUMMARY

The present invention provides a testing jig to sequentially test front and rear surfaces of a semiconductor chip and provides a method of testing a semiconductor chip using the testing jig. The testing jig mounts a semiconductor chip in such manner to leave exposed for testing both front and back surfaces, thereby allowing testing of front and back surfaces sequentially without significant intervening re-configuration. Testing can include applying heat to the semiconductor chip using a heat pad and can include detecting infrared rays emitted from a surface of the semiconductor chip using an infrared filter. Testing can include detecting hot electrons emitted from one or more surfaces of the semiconductor chip.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
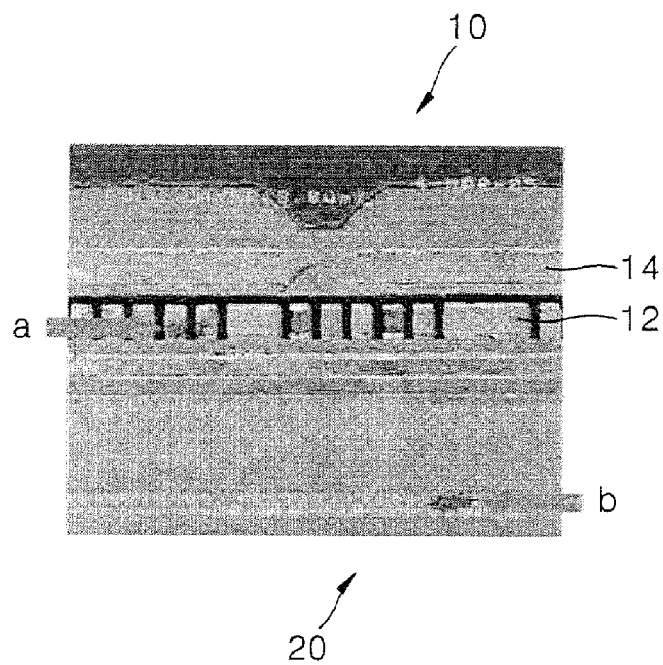
FIG. 1 is a photograph illustrating defects present in a cross-section of a conventional semiconductor chip.
Figure 2:
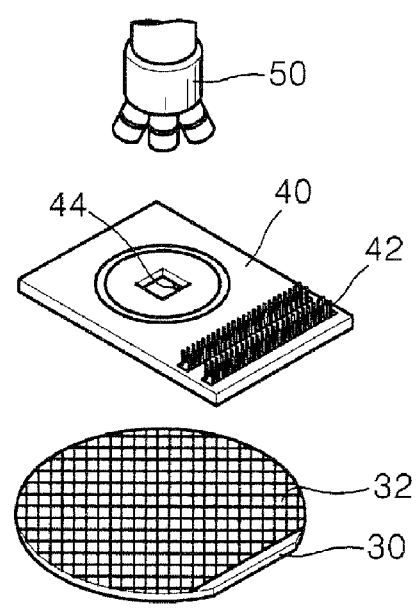
FIG. 2 is a perspective view illustrating a conventional method of testing front surfaces of semiconductor chips for defects (for example, a defect "a")
Figure 3:
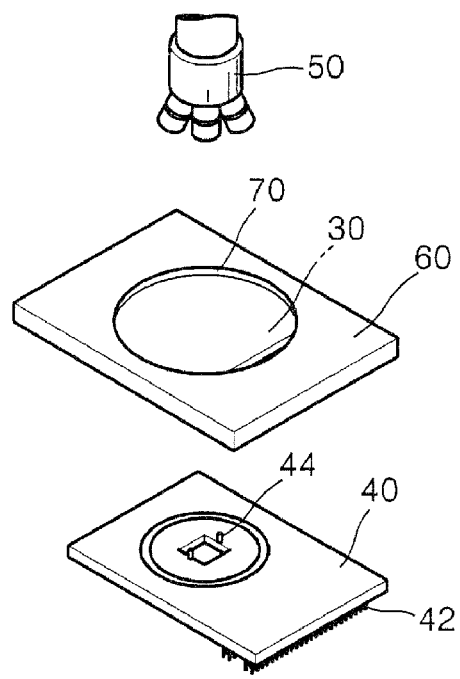
FIG. 3 is a perspective view illustrating a conventional method of testing rear surfaces of the semiconductor chips for defects (for example, a defect "b")

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. Like reference numerals in the drawings denote like elements having like descriptions.

Figure 4A:
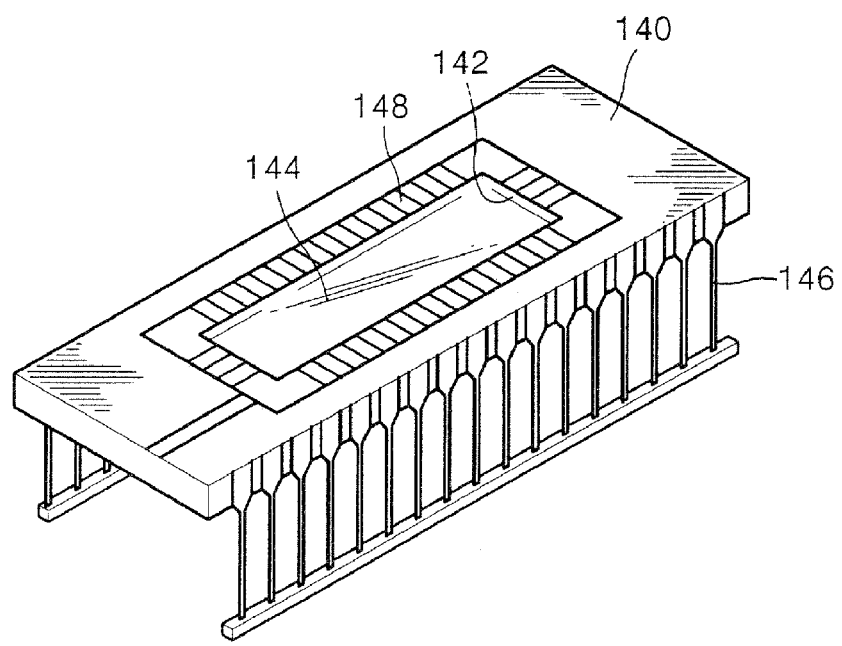
FIGS. 4A through 4C are perspective views of an infrared filter fixed to a support package according to an embodiment of the present invention.
Figure 4B:
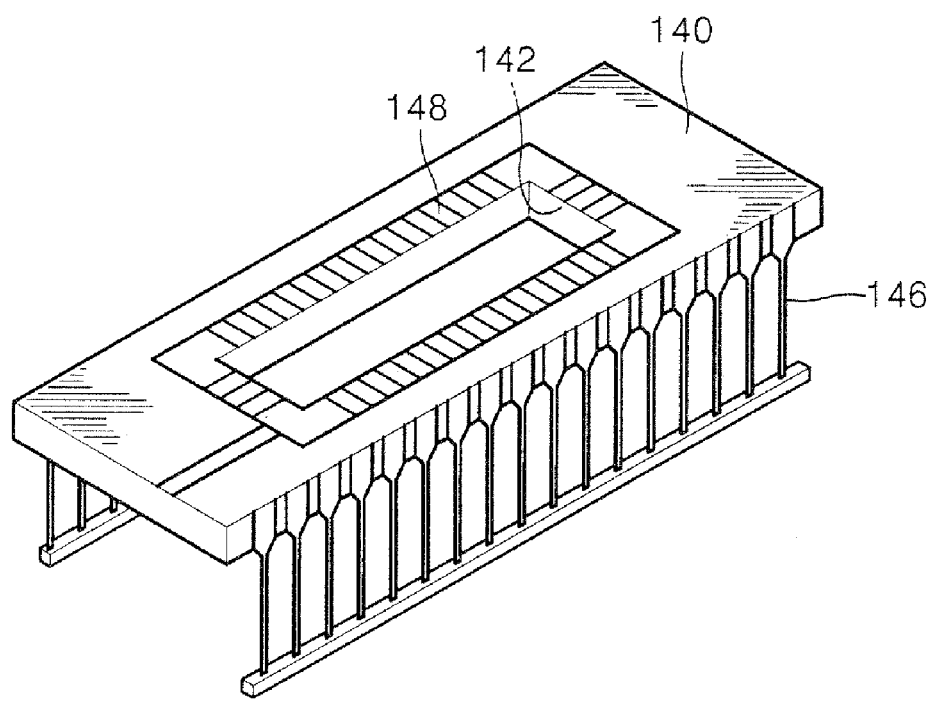
Figure 4C:
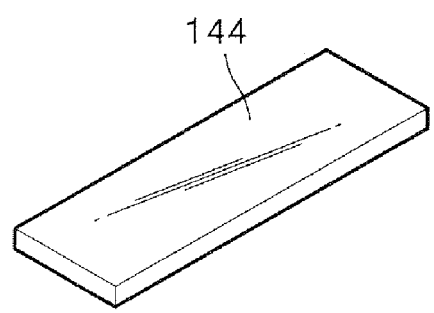

FIGS. 4A through 4C are perspective views of an infrared filter 144 fixed to a support package 140 according to an embodiment of the present invention. Referring to FIGS. 4A through 4C, the support package 140 includes a first cavity 142. A plurality of metal interconnections 148, e.g., for signal processing, are formed around the first cavity 142 in the support package 140. A plurality of pins 146 are attached to the support package 140 such that the support package 140 can be loaded on a test substrate 130 (see FIG. 6). The test package 140 may be a ceramic package.

The shape of the infrared filter 144 may be similar to that of the first cavity 142 such that the infrared filter 144 can be tightly fixed into the first cavity 142. The infrared filter 144 may be formed by covering a ceramic substrate with an active material. Alternatively, the infrared filter 144 may be formed by distributing an active material over the ceramic substrate. The infrared filter 144 may be fixed to the support package 140 by an adhesive. The infrared filter 144 can detect infrared rays with a wavelength of 1,100-1,700 nm.

Figure 5A:
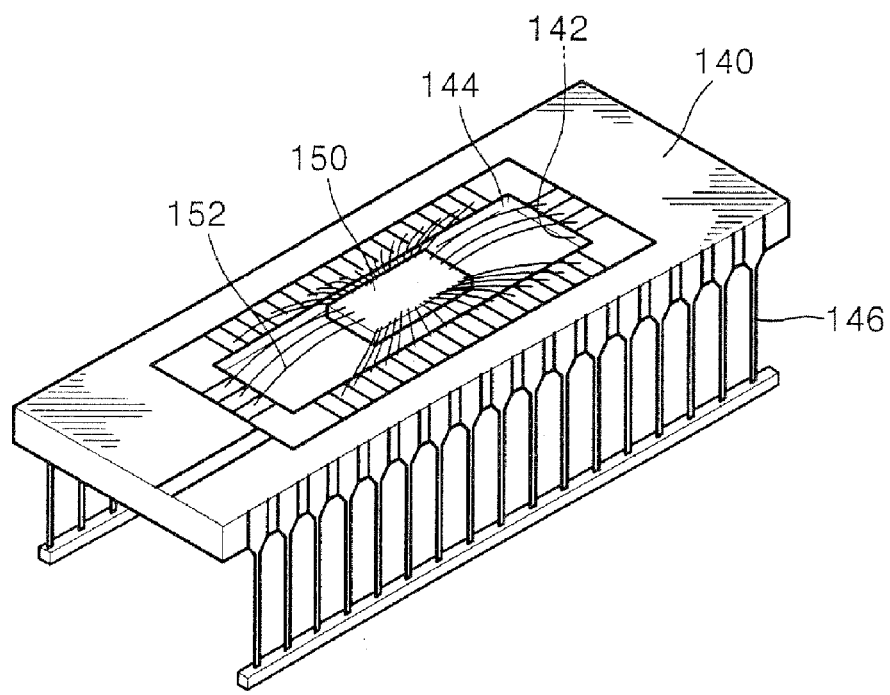
FIGS. 5A through 5C are perspective views of a semiconductor chip loaded on the support package of FIG. 4A according to an embodiment of the present invention.
Figure 5B:
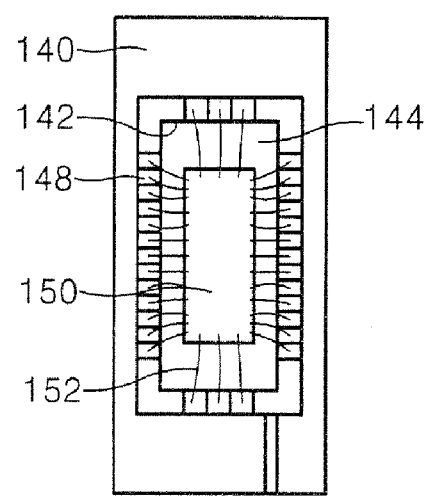
Figure 5C:
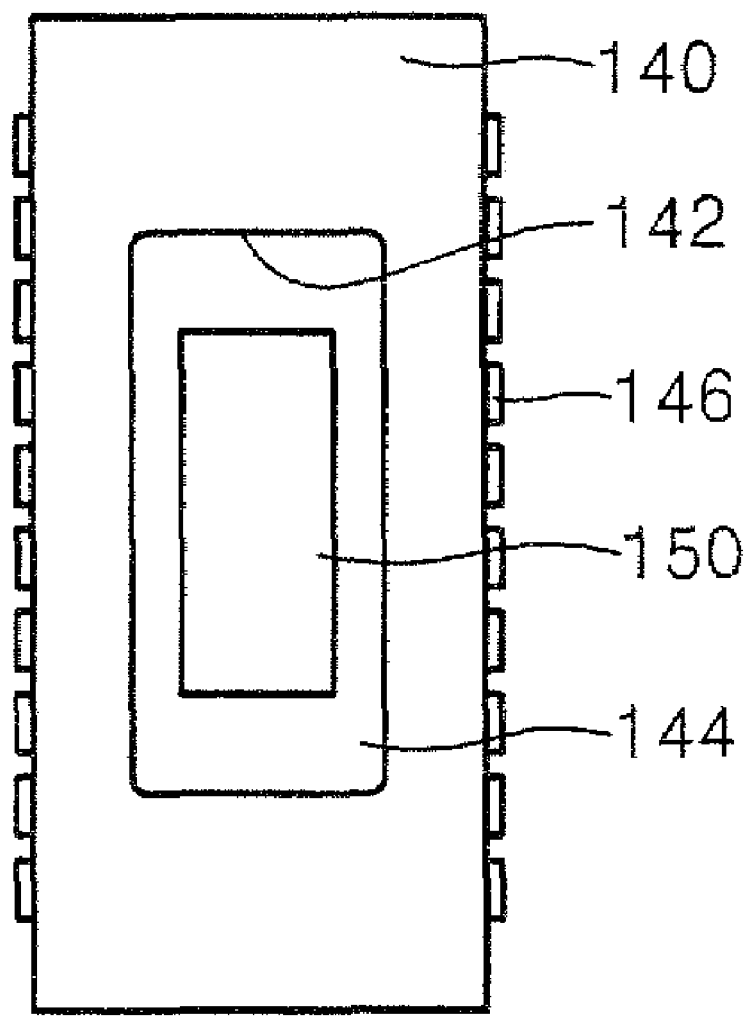

FIGS. 5A through 5C are perspective views of a semiconductor chip 150 loaded on the support package 140 of FIG. 4A according to an embodiment of the present invention.

Referring to FIGS. 5A through 5C, the semiconductor chip 150, for example, a semiconductor chip found defective through a preliminary electrical memory test, is loaded on the infrared filter 144, e.g., as previously affixed to the support package 140. At this time, the infrared filter 144 is attached to a rear surface of the semiconductor chip 150, and a front surface of the semiconductor chip 150 is exposed. Hereinafter, a first surface of the semiconductor chip 150 on which metal interconnecting layers are formed is referred to as the front surface, and a second surface opposite the first surface is referred to as the rear surface, e.g., as in the description of FIG. 1.

The semiconductor chip 150 may be attached to the infrared filter 144 using an adhesive. In this case, the semiconductor chip 150 may include at least two metal interconnecting layers. In an embodiment of the present invention, the semiconductor chip 150 may include three or more metal interconnecting layers. The semiconductor chip 150 is electrically connected to the metal interconnections 148 by way of a plurality of conductive wires 152 formed on the support package 140.

Figure 6:
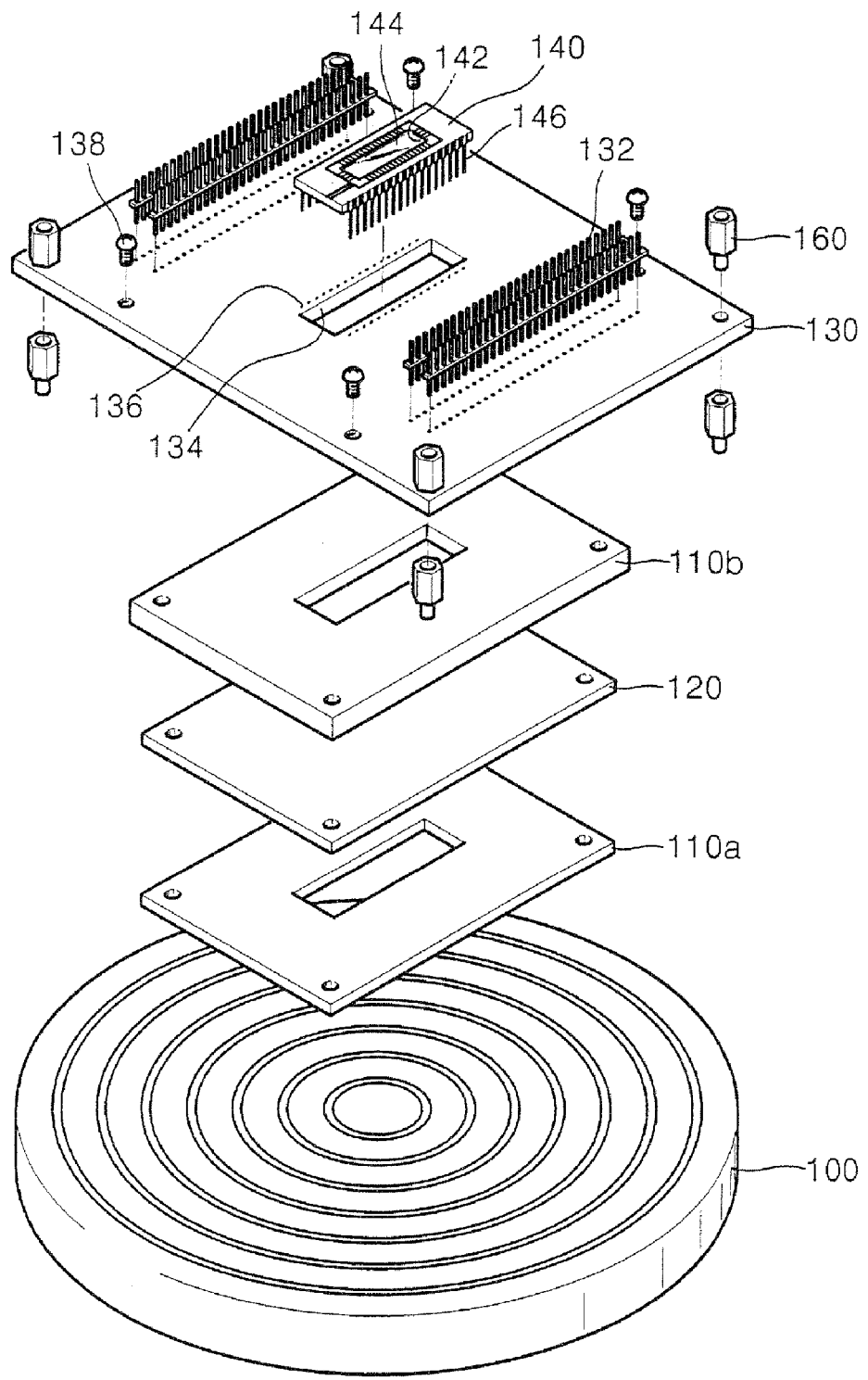
FIG. 6 is an exploded perspective view of a testing jig according to an embodiment of the present invention.

FIG. 6 is an exploded perspective view of a test jig according to an embodiment of the present invention. Referring to FIG. 6, the jig includes the support package 140, a test substrate 130, and a heat pad 120. As illustrated in FIG. 4A, the infrared filter 144 is fixed to the support package 140. The test substrate 130 has a second cavity 134 which exposes the infrared filter 144. The pins 146 of the support package 140 are fixedly inserted into a plurality of sockets 136 formed around the second cavity 134 in the test substrate 130. A plurality of contact pins 132, electrically coupled to sockets 136, exchange signals with an external device and may be formed on, for example, one or more sides of the test substrate 130. Four levelers 160 formed at four corners of the test substrate 130 adjust the balance of the jig with respect to a chuck 100.

Insulation pads 110a and 110b, attached to both sides of the heat pad 120, thermally and electrically insulate the heat pad 120. A first surface of the heat pad 120 protrudes toward the second cavity 134 such that the first surface of the heat pad 120 contacts the infrared filter 144 (see FIG. 7C). The insulation pad 110b is attached to a portion of the first surface of the heat pad 120 excluding that portion of the first surface contacting the infrared filter 144. The insulation pad 110a is attached to a second surface of the heat pad 120. The elements described above are integrated by a fixing unit 138, e.g., screws 138.

Figure 7A:
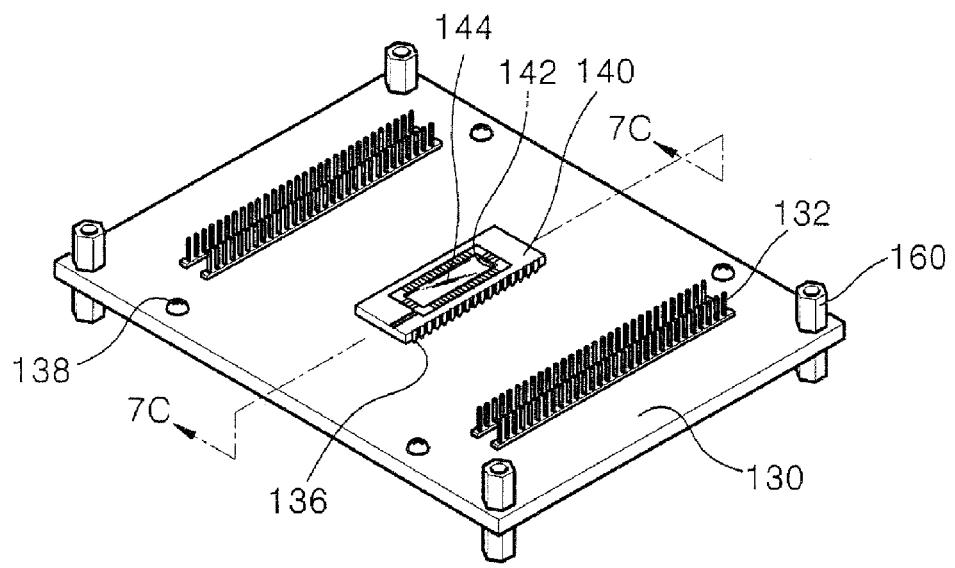
FIG. 7A is a top perspective view of the integrated jig of FIG. 6.
Figure 7B:
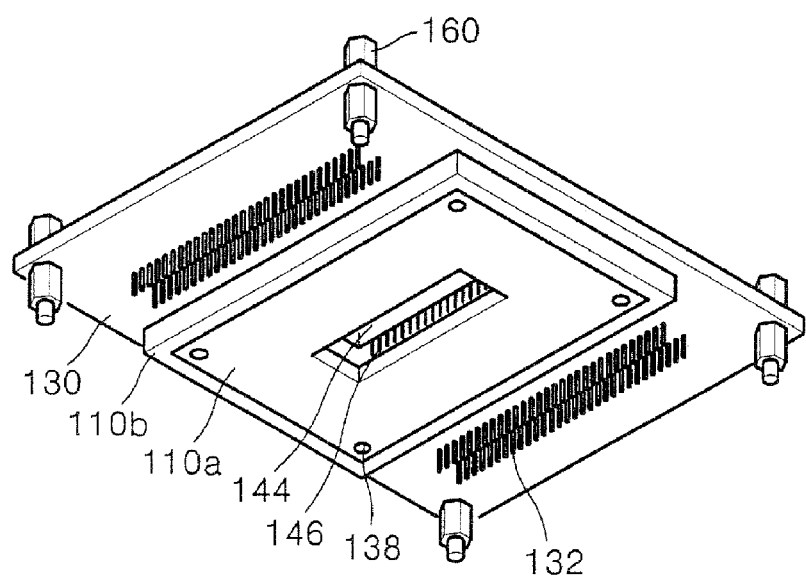
FIG. 7B is a bottom perspective view of the integrated jig of FIG. 6.
Figure 7C:
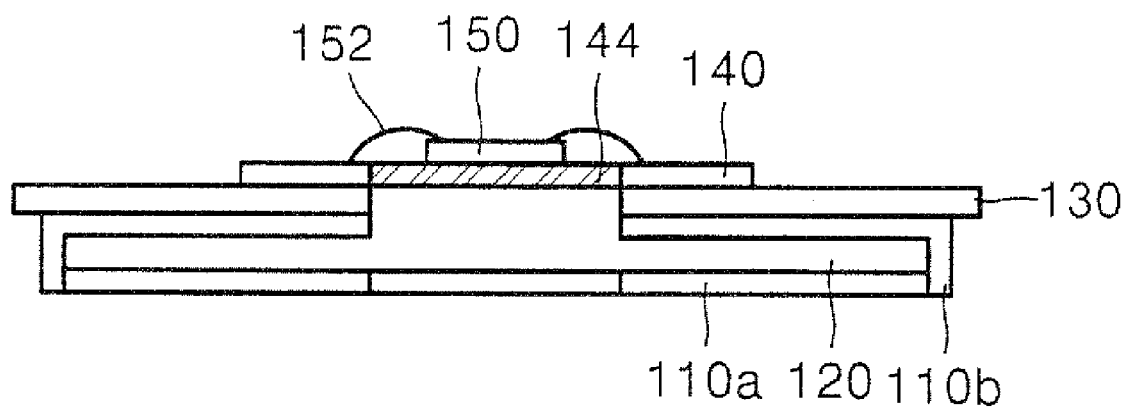
FIG. 7C is a cross section view of the jig taken along line 7C-7C of FIG. 7A.

FIG. 7A is a top perspective view of the integrated jig. FIG. 7B is a bottom perspective view of the integrated jig. For convenience, FIGS. 7A and 7B illustrate the jig without the heat pad 120. FIG. 7C is a cross sectional view of the jig including the heat pad 120, taken along line 7C-7C of FIG. 7A.

Referring to FIGS. 7A through 7C, the insulation pad 110a, the heat pad 120, the insulation pad 110b, the test substrate 130, and the support package 140 are sequentially stacked. The infrared filter 144, as affixed to the support package 140, contacts the heat pad 120. The jig allows convenient detection of infrared rays caused by hot electrons emitted from the rear surface of the semiconductor chip 150.

Figure 8:
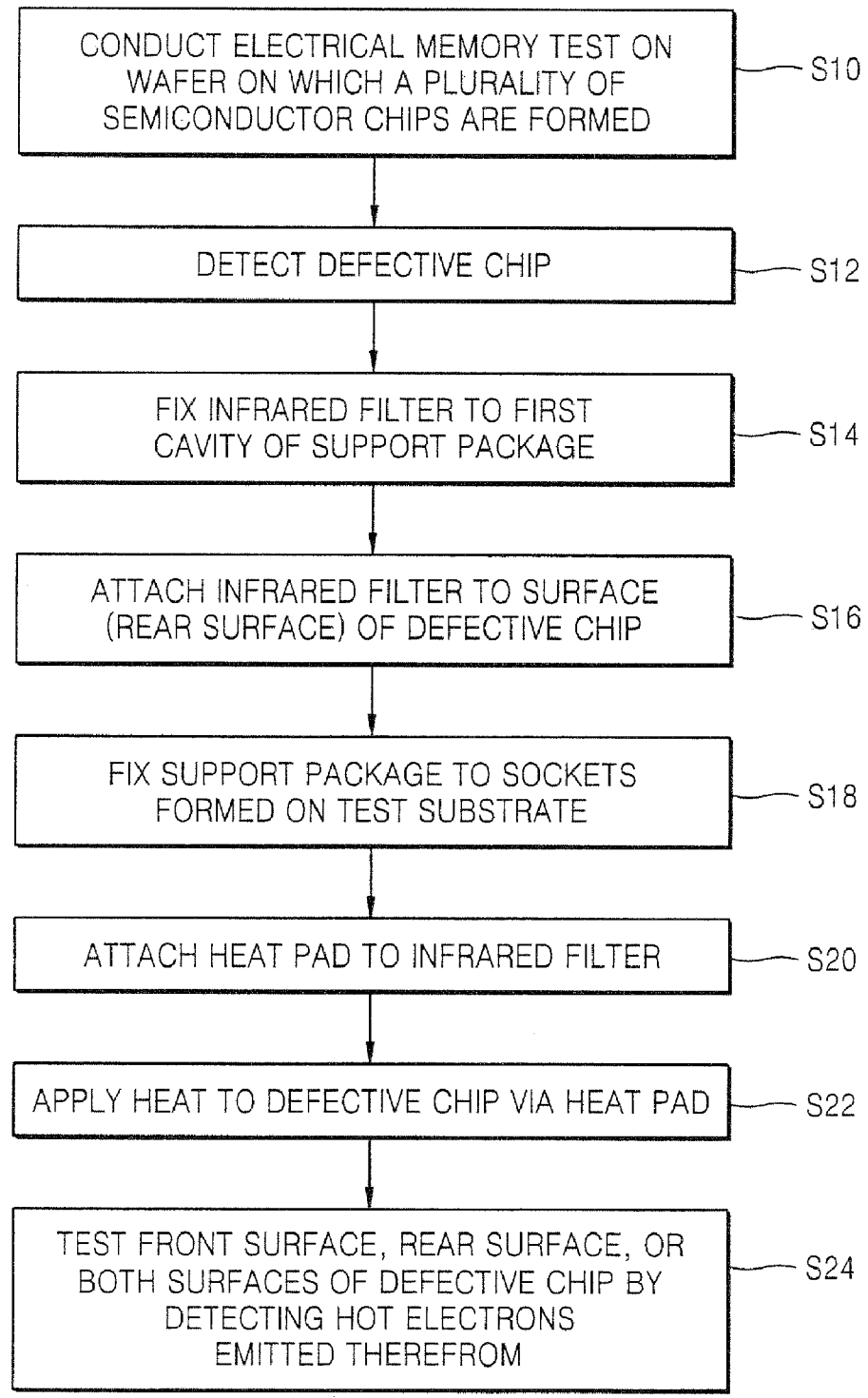
FIG. 8 is a flowchart illustrating a method of testing the semiconductor chip using the jig according to an embodiment of the present invention.

FIG. 8 is a flowchart illustrating a method of testing the semiconductor chips 150 using the jig according to an embodiment of the present invention. Referring to FIG. 8, an electrical memory test is conducted on a wafer on which the semiconductor chips 150 are formed (S10). After the electrical memory test, the semiconductor chips 150 that are defective (hereinafter referred to as defective chips) are detected and separated from the other semiconductor chips (S12). Then, the infrared filter 144 is fixed to the first cavity 142 of the support package 140 (S14). A surface (the rear surface) of the defective chip is attached to the infrared filter 144 (S16). Here, the defective chip may be made thinner by removing a predetermined amount of the rear surface of the defective chip. The support package 140 is fixed to the sockets 136 formed on the test substrate 130 (S18). In the present embodiment, the support package 140 is fixed to the sockets 136 using the pins 146, but the present invention is not limited to this method. The support package 140 may be fixed to the sockets 136 using various methods. The infrared filter 144 is exposed by the second cavity 134 of the test substrate 130.

Next, the heat pad 120 is attached to the infrared filter 144 (S20). Before the heat pad 120 is attached to the infrared filter 144, the insulation pads 110a and 110b may be attached to respective surfaces of the heat pad 120, excluding a portion of the surface of the heat pad 120 that contacts the infrared filter 144. Heat is applied to the defective chip via the heat pad 120 (S22). In this case, the temperature of the heat pad 120 may be 70-130° C. The front surface, the rear surface, or both surfaces of the defective chip are tested using an apparatus that detects hot electrons emitted from a defective chip (S24). In the present embodiment, the leakage current of the defective chip is detected as a function of detected hot electron emissions. However, a variety of methods of detecting the leakage current may be used without departing the spirit and scope of the present invention.

Figure 9A:
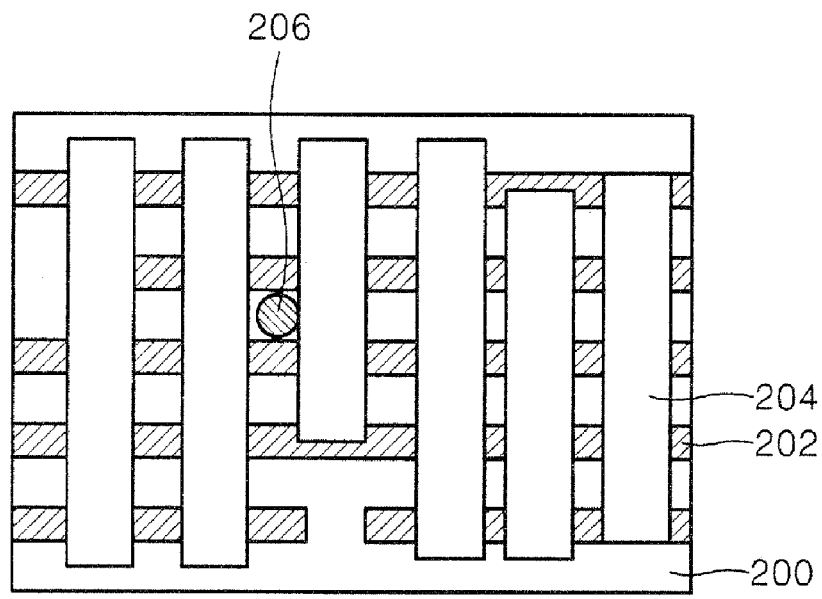
FIG. 9A is a top view of an example of a defective chip.
Figure 9B:
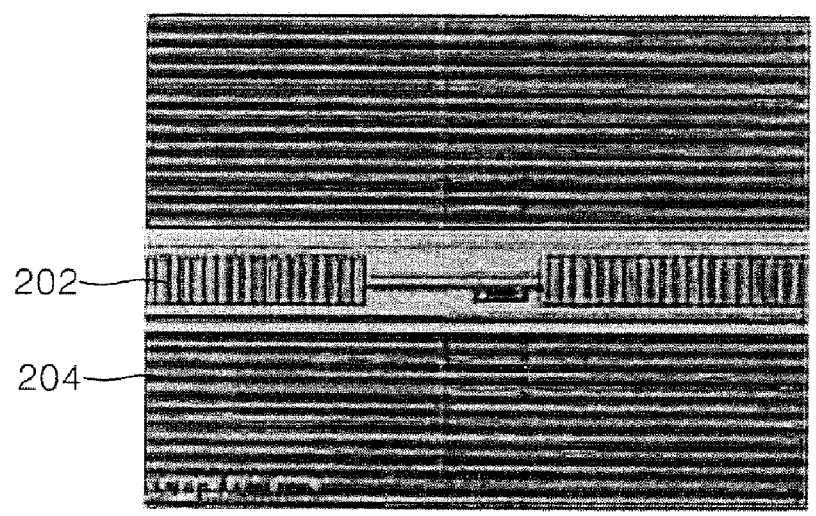
FIG. 9B is a photograph of the defective chip illustrated in FIG. 9B.
Figure 10:
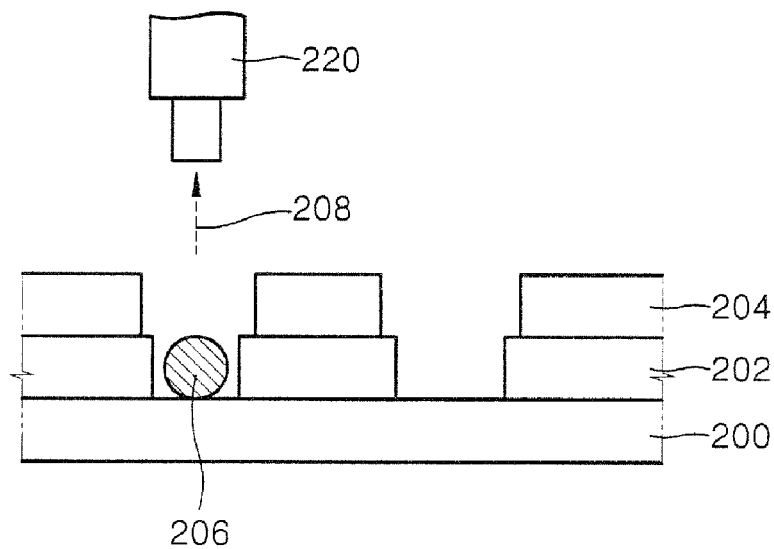
FIG. 10 is a schematic view illustrating a method of testing the front surface of the defective chip of FIG. 9A according to an embodiment of the present invention.

FIG. 9A is a top view of an example of a defective chip. FIG. 9B is a photograph of the defective chip illustrated in FIG. 9A. FIG. 10 is a schematic view illustrating a method of testing the front surface of the defective chip of FIG. 9A according to an embodiment of the present invention.

Referring to FIGS. 9A through 10, a first metal interconnecting layer 202 and a second metal interconnecting layer 204 are formed on a semiconductor substrate 200. It is assumed that a defect 206 exists within the first metal interconnecting layer 202. A hot electron analyzer (HEA) detects a hot electron 208 emitted from the front surface of the defective chip. Accordingly, the HEA can confirm the existence of the defect 206 within the first metal interconnecting layer 202.

Figure 11A:
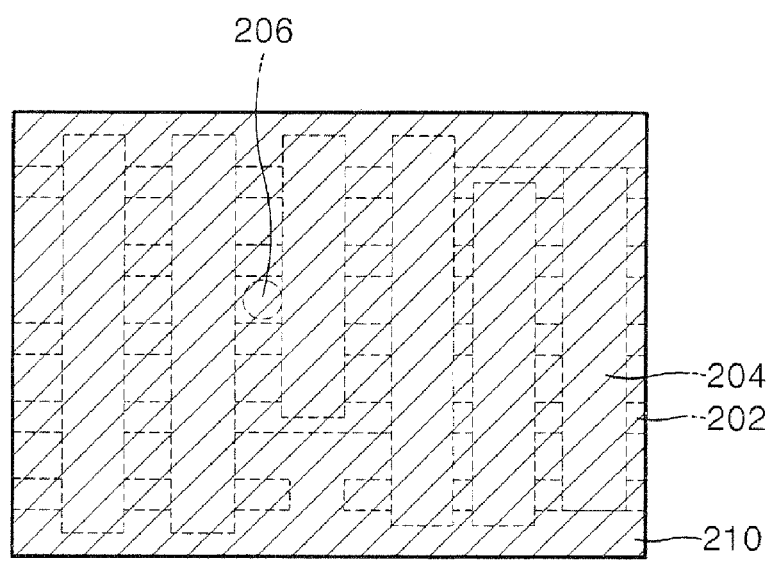
FIG. 11A is a top view of another example of a defective chip.
Figure 11B:
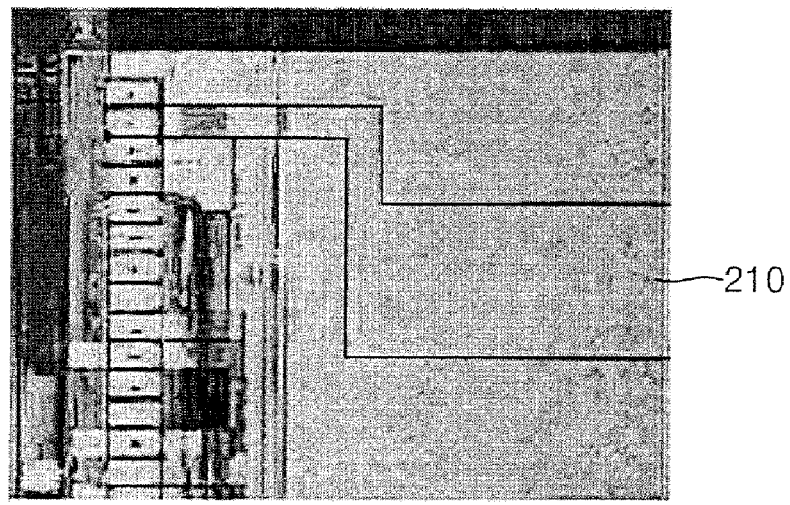
FIG. 11B is a photograph of the defective chip illustrated in FIG. 11B.
Figure 12:
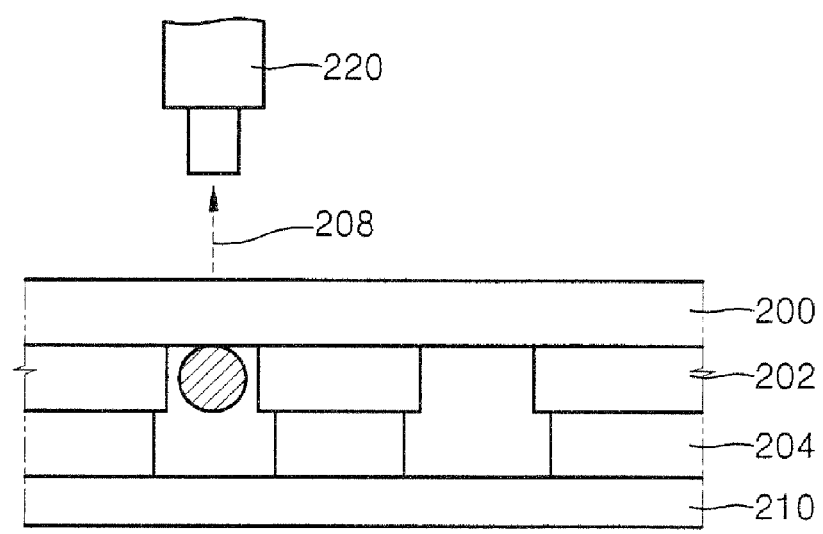
FIG. 12 is a schematic view illustrating a method of testing the rear surface of the defective chip of FIG. 11A according to an embodiment of the present invention.

FIG. 11A is a top view of another example of a defective chip. FIG. 11B is a photograph of the defective chip illustrated in FIG. 11B. FIG. 12 is a schematic view illustrating a method of testing the rear surface of the defective chip of FIG. 11B according to an embodiment of the present invention.

Referring to FIGS. 11A through 12, a first metal interconnecting layer 202, a second metal interconnecting layer 204, and a third metal interconnecting layer 210 are formed on a semiconductor substrate 200. The third metal interconnecting layer 210 is for multi-chip packages, for example, and may be thicker than the second metal interconnecting layer 204. It is assumed that a defect 206 exists within the first metal interconnecting layer 202. The HEA detects a hot electron 208 emitted from the rear surface of the defective chip. Accordingly, the HEA can confirm the existence of the defect 206 within the first metal interconnecting layer 202.

If the defect 206 illustrated in FIG. 11A is detected using the setup illustrated in FIG. 10, the hot electron 208 emitted from the front surface of the defective chip may be blocked by the third metal interconnecting layer 210. Accordingly, the HEA may not detect and confirm the existence of the hot electron 208. Therefore, testing the rear surface of the defective chip may avoid the blocking influence of the third metal interconnecting layer 210.

When the jig of FIG. 6 is used to test the defective chip, the orientation of the defective chip can be easily changed as desired for testing. In other words, no additional setup is required to test the rear surface of the defective chip, as is required in the conventional art. All that is required is to turn the jig upside down.

According to the present invention, the front surface or the rear surface of the defective chip can be tested. Alternatively, the front surface and the rear surface of the defective chip can be sequentially tested. The location of a defect can be more accurately identified than when both the front and rear surfaces of the defective chip are tested. That is, it is desirable to test both surfaces of the defective chip. In particular, the jig according to the present invention is useful for sequentially testing both surfaces of the defective chip.

As described above, according to a method of testing a semiconductor chip and a jig used in the method, front and rear surfaces of a semiconductor chip can be easily and sequentially tested according to the state of defective chip by using the integrated jig. In addition, since the jig includes an infrared filter and a heat pad, heat can be easily transmitted to the defective chip.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A jig for testing a semiconductor chip, the jig comprising:
   a support package having a first cavity;
   an infrared filter to affix to the support package relative to the first cavity and to attach to a rear surface of the semiconductor chip; and
   a test substrate to which the support package is mountable and having a second cavity to expose the infrared filter.

2. The jig of claim 1, further comprising the semiconductor chip, the semiconductor chip having at least three metal interconnecting layers.

3. The jig of claim 1, wherein the support package comprises a plurality of metal interconnections disposed in relation to the first cavity to establish signal processing relative to a semiconductor chip when affixed to the infrared filter.

4. The jig of claim 1, wherein the support package comprises a plurality of pins to couple to the test substrate.

5. The jig of claim 1, wherein the support package is connectable to the semiconductor chip by a plurality of conductive wires.

6. The jig of claim 1, further comprising a heat pad to contact an exposed surface of the infrared filter.

7. The jig of claim 6, further comprising insulation attachable a first surface of the heat pad excluding a portion of the first surface contacting the infrared filter and attachable to a second surface of the heat pad.

8. The jig of claim 1, wherein the infrared filter detects infrared rays with a wavelength of 1,100-1,700 nm.

9. A method of testing a semiconductor chip, the method comprising:
   detecting a defective chip;
   preparing a support package having a first cavity;
   affixing an infrared filter relative to the first cavity;
   attaching the infrared filter to a rear surface of the defective chip;
   affixing the support package to a test substrate having a second cavity exposing the infrared filter; and
   testing for defects relative to at least one surface of the defective chip.

10. The method of claim 9, wherein detecting the defective chip comprises an electrical memory test.

11. The method of claim 9, further comprising removing a predetermined portion of the at least one surface of the defective chip.

12. The method of claim 9, wherein the defective chip has at least three metal interconnecting layers.

13. The method of claim 9, further comprising connecting the defective chin to the support package using a plurality of conductive wires after the affixing of the infrared filter relative to the first cavity.

14. The method of claim 9, wherein affixing the support package to the test substrate comprises inserting a plurality of pins formed on the support package into a plurality of sockets formed around the second cavity of the test substrate.

15. The method of claim 9, further comprising contacting a heat pad with a surface of the infrared filter after the affixing the support package.

16. The method of claim 15, wherein testing for defects comprises:

applying a predetermined amount of heat to the defective chip using the heat pad; and detecting infrared rays emitted from a surface of the defective chip using the infrared filter.

17. The method of claim 16, wherein a temperature of the heat pad is 70° C. to 130° C.

18. The method of claim 9, wherein testing for defects comprises steps to detect hot electrons emitted from both surfaces of the defective chip.

19. A semiconductor testing jig comprising:

a substrate having a semiconductor mounting site mounted thereon and signal processing conductors electrically connectable to a semiconductor chip to be tested, the semiconductor mounting site supporting a selected one of a pair of opposing surfaces of the semiconductor chip to be tested while leaving exposed both opposing surfaces;

wherein the semiconductor mounting site includes an infrared filter.

20. The testing jig of claim 19, wherein a surface of the semiconductor chip is exposed through the infrared filter.

* * * * *